(12) United States Patent
Gabrielson et al.

(10) Patent No.: US 7,290,194 B2
(45) Date of Patent: Oct. 30, 2007

(54) SYSTEM FOR PERFORMING AUTOMATIC TEST PIN ASSIGNMENT FOR A PROGRAMMABLE DEVICE

(75) Inventors: Donald Gabrielson, Rochester, MN (US); Todd Youngman, Rochester, MN (US); John Nordman, Rochester, MN (US); Michael A. Minter, Bowling Green, KY (US)

(73) Assignee: LSI Corporation, Milpitas, CA (US)

( * ) Notice: Subject to any disclaimer, the term of this patent is extended or adjusted under 35 U.S.C. 154(b) by 346 days.

(21) Appl. No.: 11/016,192

(22) Filed: Dec. 17, 2004

(65) Prior Publication Data

US 2006/0156142 A1 Jul. 13, 2006

(51) Int. Cl.
*G01R 31/28* (2006.01)
(52) U.S. Cl. ...................................... 714/742
(58) Field of Classification Search ................ 714/742, 714/724, 733
See application file for complete search history.

(56) References Cited

U.S. PATENT DOCUMENTS

| | | | |
|---|---|---|---|
| 6,678,645 B1 * | 1/2004 | Rajsuman et al. | 703/20 |
| 6,694,464 B1 * | 2/2004 | Quayle et al. | 714/725 |
| 7,039,545 B2 * | 5/2006 | Bundy et al. | 702/119 |
| 7,073,109 B2 * | 7/2006 | Kolman | 714/724 |

* cited by examiner

*Primary Examiner*—James C. Kerveros
(74) *Attorney, Agent, or Firm*—Christopher P. Maiorana PC

(57) ABSTRACT

A tool for facilitating automatic test pin assignment for a programmable platform device including a process for collecting information related to the programmable platform device, a process for automatically initializing a test pin assignment for the programmable platform device, a process configured to receive user specifications for IOs and a process for performing dynamic test pin reassignment in response to the user specifications.

20 Claims, 4 Drawing Sheets

SYSTEM FOR PERFORMING AUTOMATIC TEST PIN ASSIGNMENT FOR A PROGRAMMABLE DEVICE

FIELD OF THE INVENTION

The present invention relates to Very Large Scale Integrated (VLSI) circuit design generally and, more particularly, to a method and/or tool for automatic test pin assignment.

BACKGROUND OF THE INVENTION

In a conventional design methodology for a programmable platform device (e.g., platform and structured application specific integrated circuits (ASICs)), a developer assigns up to 256 Low Pin Count (LPC) pins for each slice. Each of the pins of a slice are categorized as No Test, Dedicated, Shared, or Reserved. If a pin is marked as Dedicated, Shared, or Reserved, the pin is considered a LPC pin.

The conventional methodology can be too restrictive. With the conventional methodology, scan pins are fixed and there are certain classifications of buffers that cannot be used for test sharing. For example, if a layout includes a 32 bit stub series termination logic (SSTL) bus, the probability is quite high that a pin to be used will be marked as a test_share pin. However, SSTL buffers cannot be used with test_share pins.

The conventional solution involves the manufacturer manually changing the limited amount of test pins. The process is manual, error prone, and time consuming. In addition, changes can only be performed by the manufacturer. Therefore, a vendor must rely on the manufacturer to make the changes. Only non-scan pins are allowed to change with the current methodology.

It would be desirable to have a method and/or tool for automatic test pin assignment.

SUMMARY OF THE INVENTION

The present invention concerns a tool for facilitating automatic test pin assignment for a programmable platform device comprising: a process for collecting information related to the programmable platform device, a process for automatically initializing a test pin assignment for the programmable platform device, a process configured to receive user specifications for IOs and a process for performing dynamic test pin reassignment in response to the user specifications.

The objects, features and advantages of the present invention include providing a method and/or tool for automatic test pin assignment that may (i) automatically assign test pins during development, (ii) increase quality, (iii) decrease time to market (TAT), (iv) reduce non-recurring engineering (NRE) costs, (v) automatically re-assign test pins based on user interaction, (vi) perform re-assignment transparently to the user, (vii) automatically change a test function when an IO that is non-sharable is selected for test and/or (viii) allow for moving scan pins within valid locations.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
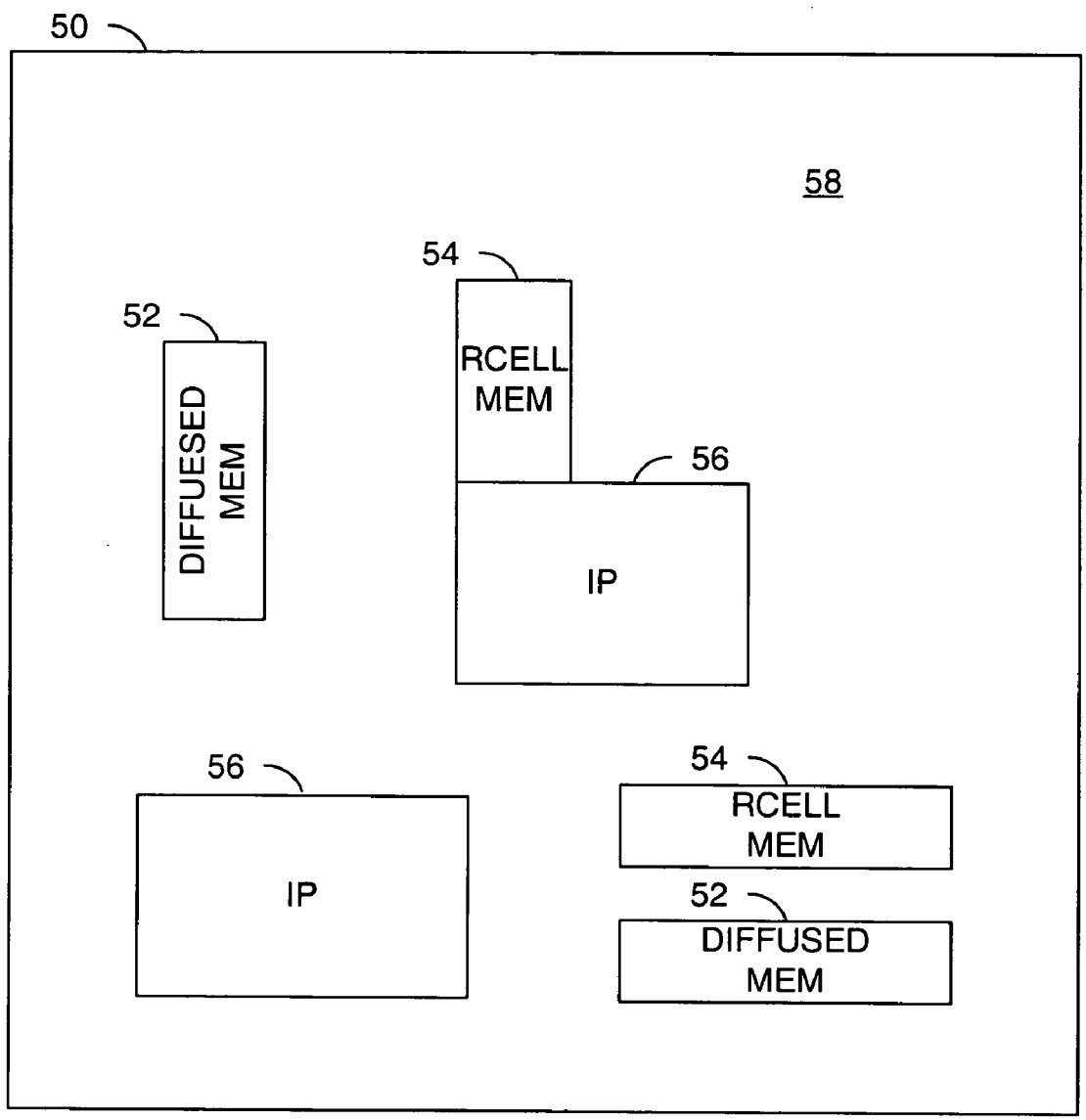
FIG. 1 is a block diagram illustrating an example programmable platform device.

Referring to FIG. 1, a block diagram of a programmable platform device (or die or slice) 50 is shown in accordance with a preferred embodiment of the present invention. In one example, the device 50 may comprise one or more regions of diffused memory 52, one or more regions of R-cell memory 54, one or more hard macros 56 and a diffused region 58. In another example, multiple diffused regions 58 may be implemented. The regions 52, 54, 56, and 58 may be distributed around the slice 50.

The regions 56 may include diffused patterns of a circuit design that is customized and optimized for a particular function. The hard macros implemented in the regions 56 may also be referred to IP (intellectual property) blocks. The hard macros generally act similarly to an ASIC design. In general, the hard macros 56 may be implemented to provide a number of functions on the device 50. For example, the hard macros 56 may comprise phase locked loops (PLLs), instances of processors, input/output PHY level macros, etc. The regions 56 may comprise similar and/or different hard macros.

The diffused regions 58 may be customized, in one example, as logic, memory and/or firm or soft IP. For example, the regions 58 may be implemented as a sea of gates array. In one example, the regions 58 may be implemented with a number of R-cells. As used herein, R-cells generally refer to an area of silicon designed (or diffused) to contain one or more transistors that have not yet been personalized (or configured) with metal layers. Wire layers may be added to the R-cells to make particular transistors, logic gates, storage elements (e.g., the R-cell memories 54) and/or soft or firm IP.

An R-cell generally comprises one or more diffusions for forming the parts of transistors and the contact points where wires may be attached in subsequent manufacturing steps (e.g., to power, ground, inputs and outputs). In general, the R-cells may be, in one example, building blocks for logic and/or storage elements (e.g., the R-cell memories 54). For example, one way of designing a chip that performs logic and storage functions may be to lay down numerous R-cells row after row, column after column. A large area of the chip may be devoted to nothing but R-cells. The R-cells may be personalized (or configured) in subsequent production steps (e.g., by depositing metal layers) to provide particular logic functions. The logic functions may be further wired together (e.g., a gate array design).

In one example, a number of slices 50 may be fabricated having different varieties and/or numbers of hard macros and diffused memories. The slices 50 may be fabricated with different varieties and numbers of IOs around the periphery of the slice. By fabricating a variety of slices with a variety of hard macros and diffused memories, a wide variety of applications may be supported. For example, a particular slice may be selected for customization because the particular hard macros implemented are suitable for a customized application. Once a slice has been customized, the slice may be referred to as an instance.

Figure 2:
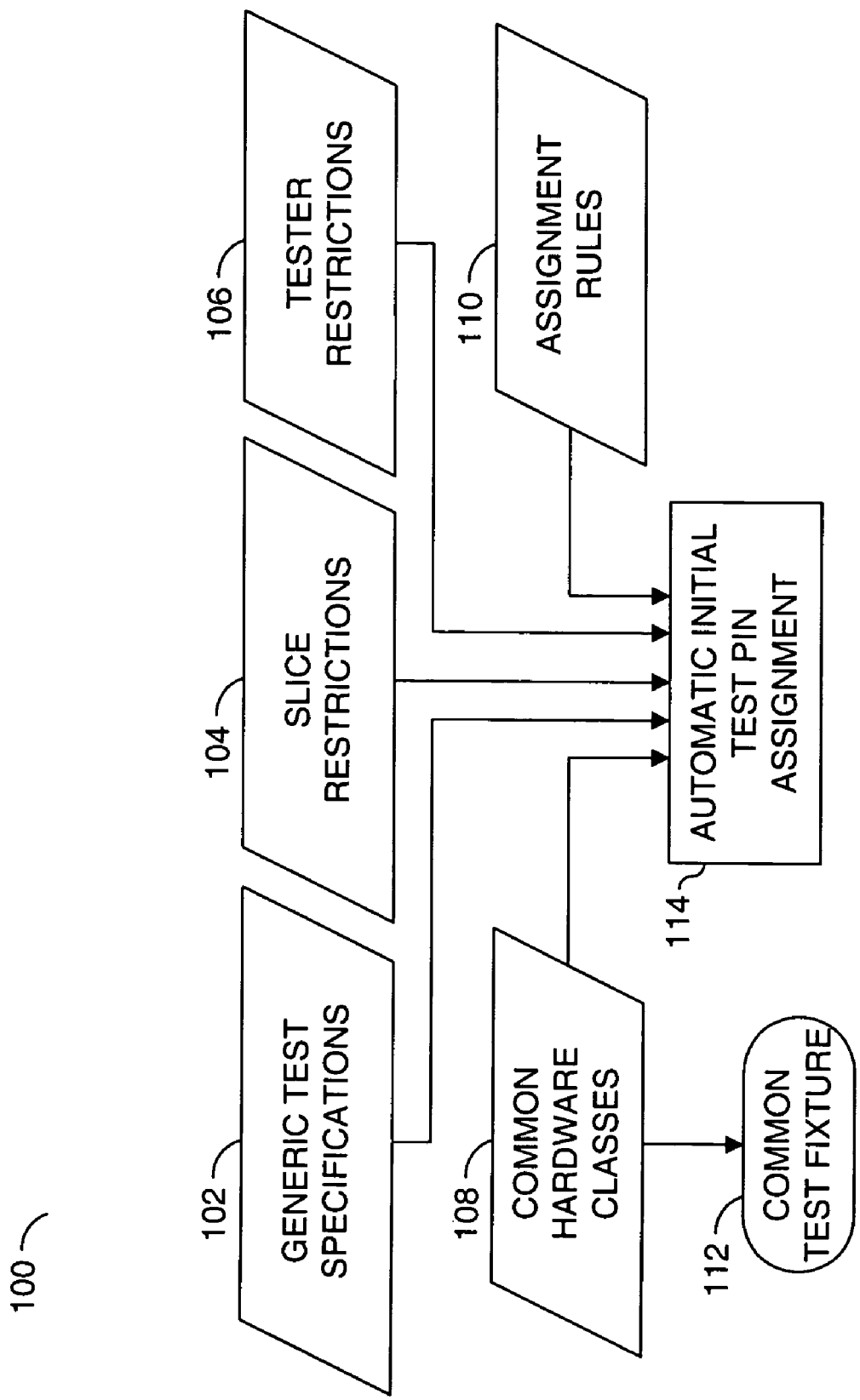
FIG. 2 is a flow diagram illustrating a process for initializing test pins on a slice in accordance with a preferred embodiment of the present invention.

Referring to FIG. 2, a flow diagram is shown illustrating an example operation of a design flow (or tool) 100 implemented in accordance with a preferred embodiment of the present invention. In one example, a number of types of information may be input into the design flow 100. For example, the design flow 100 may receive information regarding generic test specifications (e.g., the block 102), information regarding slice restrictions (e.g., the block 104), information regarding tester restrictions (e.g., the block 106), information regarding common hardware classes (e.g., the block 108) and information regarding assignment rules (e.g., the block 110). The information regarding common hardware classes may also be used by a common test fixture (e.g., the block 112). The design flow 100 may be configured to automatically initialize test pin assignments for a slice based upon the information received (e.g., the block 114).

Figure 3:
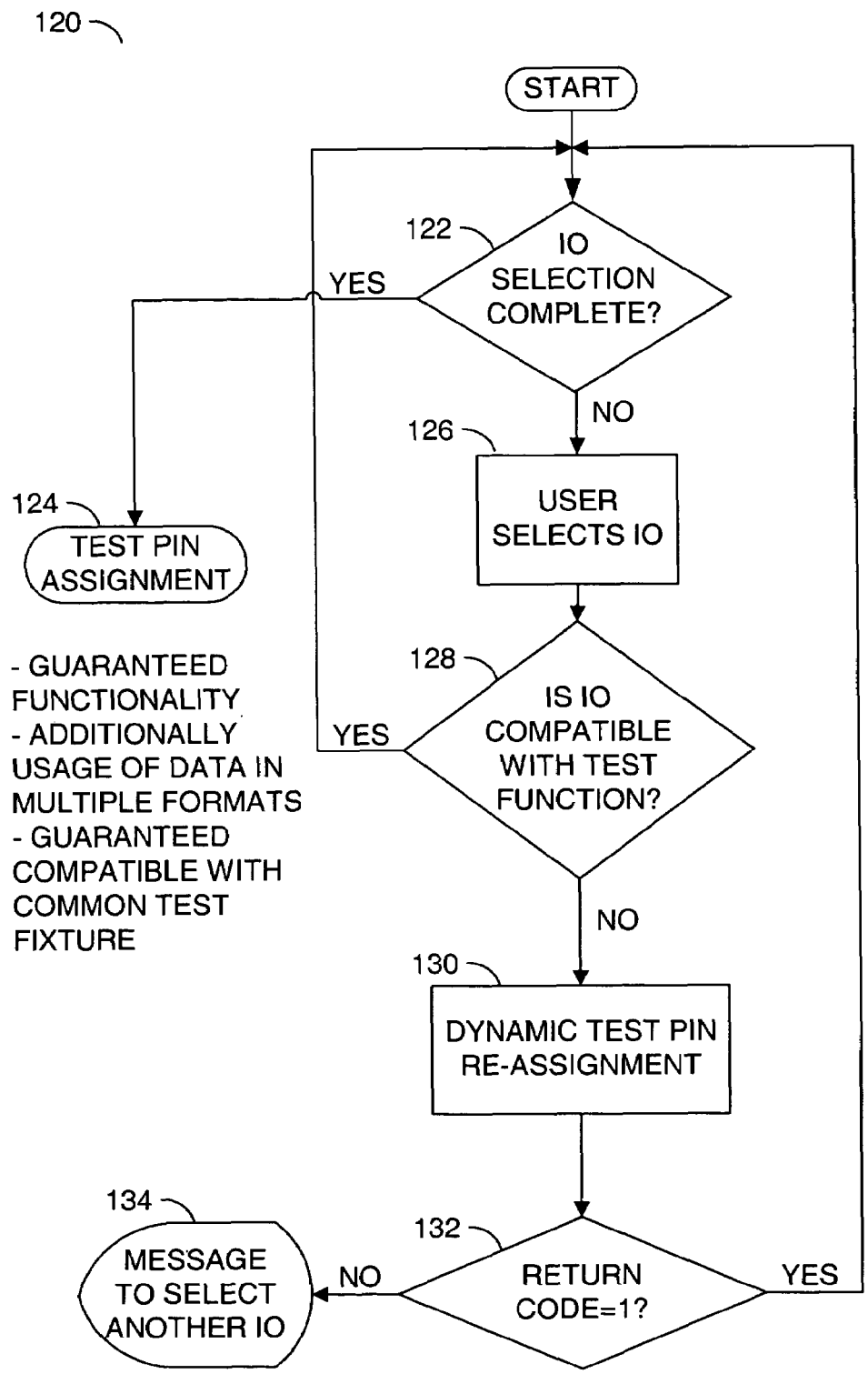
FIG. 3 is a flow diagram illustrating a process for automatic assignment of test pins on a particular instance of a slice in accordance with a preferred embodiment of the present invention.

Referring to FIG. 3, a flow diagram is shown illustrating an example instance creation process 120 implemented in accordance with a preferred embodiment of the present invention. The instance creation process 120 may begin by examining a design to determine whether IO selection for the design is complete (e.g., the block 122). If the selection of IO pins is complete, the instance creation process 120 generally moves to a step of test pin assignment (e.g., the block 124). The test pin assignment process 124 may be implemented, for example, to (i) guarantee functionality, (ii) provide for additional uses of data in multiple formats and/or (iii) guarantee compatibility with common test fixtures.

Test pin assignment may be accomplished through setting up the correct IO properties so that the assignment process may be automatically performed. Prior to completing the slice design, the slice designer may, in one example, set up a file with the constraints for each IO. It is common in the industry today to manually select IO test pin assignment by understanding the rules or constraints for each IO.

In order to maximize tester memory usage, each Tester Memory Segment (TMS) has a definition of how many scan_in and scan_out pins may be located on a particular TMS. The automatic test pin assignment 124 generally looks at the TMS definitions for each slice to determine how to properly distribute the scan pin assignments. The remaining (non-scan pin) test functions may be, in one example, randomly assigned to shared IO classifications.

When the process 120 determines that the IO selection is not complete, the process 120 may move to a state 126. In the state 126, the process 120 generally provides for developer input to select IOs (e.g, a prompt may be generated to request information from the developer). In one example, a graphic user interface (GUI) may be implemented with pull down menus for aiding the designer in selecting the IOs. A selected IO is generally examined to determine whether the selected IO is compatible with the test function (e.g., the block 128). If the IO is compatible with the test function, the process 120 generally returns to the block 122 to determine whether the IO selection is complete.

When the IO selected by the user is not compatible with the test function, a dynamic test pin re-assignment operation may be initiated (e.g., the block 130). A rule checker operation may be performed. The rule checking may be performed using convention techniques. Following performance of the rule checker operation, an examination may be performed to see whether additional IOs are available for re-assignment. When additional IOs are available, the dynamic test pin re-assignment process may indicate the automatic re-assignment of the test pin (e.g., a return code equal to 1). When additional IOs are not available, the dynamic test pin re-assignment process may indicate that the test pin was not re-assigned (e.g., a return code equal to 0). When the dynamic test pin re-assignment process completes re-assigning a test pin, the process 120 generally returns to the step 122 (the YES path from the block 132). When additional IOs are not available, a message may be provided to the developer instructing that another IO be selected (e.g., the block 134).

The present invention generally provides a methodology for assigning IOs for manufacturer testing. The assigned IOs may include IOs dedicated for testing and IOs that are shared for testing. Programmable platform devices are generally provided to reduce non-recurring engineering (NRE) costs and provide shorter product time-to-market (TAT). Design Center TAT may be shortened by creating IO definitions (e.g., in an IO definition file) that may be used by the design tools. Sharing information may be added to the IO definition file based on test information. In addition, test sharing functions may be pre-determined to save time for the Design Center.

To reduce NRE costs, the present invention may use common hardware for sort and common hardware for final test. The present invention may also enable sort hardware to be tested on a Low Pin Count (LPC) tester by assigning all test pins to 256 LPC pins. Within the 256 pins, pins may be categorized as No Test, Dedicated, Shared, or Reserved. When a pin is marked as Dedicated, Shared, or Reserved, the pin is considered a LPC pin. The No Test classification generally indicates that no test sharing is allowed. The Dedicated classification is generally used for designating manufacturer dedicated test signals in addition to dedicated test pins.

The Shared classification may be used for IOs that are shared with user function and manufacturing testing. In one example, a platform test info field may be implemented in the design tool with symbolic test names that are defined at slice development. The platform test info field may also comprise information (or rules) that may be used to determine what can and what cannot be done. The symbolic test names may be used to determine what test pins may be shared with the user defined IO. Examples may include, but are not limited to, scan_in, scan_out, scan_clock, and test_ip_in. The Reserved classification may be used to identify a LPC pin that is not used for test sharing. The Reserved classification may also be used for diffused IO that are used to make contact with a test head at sort testing.

In order to assign the pins for a slice, the developer first identifies the maximum number of test pins on the slice. The maximum number of test pins is generally identified based on a combination of diffused elements on the slice. The maximum number may also take into consideration what the user may add on a slice that will add additional test pins (e.g., High Impedance Controllers and soft or firm IP). There may be specific (diffused) elements on the slice that use test pins. For example, a slice may comprise one or more high-speed serial communication cores. Each core may have IO pins used for testing. The pins may be marked as RESERVED. In one example, a test information entry in the IO definition file may be left blank to indicate reserved pins. In addition, a particular core may have IOs (e.g., TEST_IP_IN[0:5] and TEST_IP_OUT[0:6]) implemented as shared IO test pins. Another core on the slice may also have dedicated IO pins. The second core may share the same shared IO test pins (e.g., TEST_IP_IN[0:5] and TEST_IP_OUT[0:6]) used for the first core.

In addition to known resources on the slice, test pins may be assigned for additional resources that may be implemented on the slice that are not diffused. Additional types of resources may include non-diffused memory (e.g., memory implemented in a programmable transistor fabric of the slice), a High Impedance Controller, and/or a second test access port (TAP) Controller (e.g., IP_TAP, ip_tap_tms, ip_tap_trstn, ip_tap_tdi, ip_tap _tck). Pins may also be added in order to accommodate IP legacy wrappers that may have older versions of test inserted. For example, the following pins may be added: SCAN_SETN, SCAN_RESETN, SCAN_SETRESETN.

Further slice considerations may include: scan in/out, scan clock, and High Impedance Controllers. Slices may have a number of scan chains. In one example, 16 scan chains may be implemented. In one example, a slice may be implemented with 16 scan clocks identified for testing. If more scan clocks are desired, the additional clocks may be assigned to other LPC pins by the design tool. In one example, a slice design may be limited to one High Impedance Controller. In another example, a slice may be implemented with several High Impedance Controllers.

The number of test inputs and test outputs is generally determined for all of the diffused IP on a slice. The number may be determined, in one example, in an IP netlist. Most of the signals may be shared among similar and dissimilar IP. Merging information may be provided in a documentation of the particular IP.

In one example, extra Low Pin Count pins may be identified (provided) to provide for new or additional test pins not identified during initial design stages. For example, five test pins may be selected, marked as shared in the design tool, and have a test info field left empty. The design tool may be configured to create five extra test buffers in the IO definition file. The extra test buffers may be marked flag. The extra test buffers may be used for testing.

In one example, a table (e.g., TABLE 1 below) may be used to identify all of the test pins for a slice.

TABLE 1

| Object Type | Non-Shared IO Pins | Shared IO Pins |
|---|---|---|
| Dedicated | IDDT* | |
| | TN* | |
| | PROCMON* | |
| | SCAN_ENABLE* | |
| | TCK* | |
| | TMS* | |
| | TDI* | |
| | TDO* | |
| | TRSTN* | |
| PLL | | Pins for each PLL |
| | | PLL_REF_CLK |
| | | PLL_LOCKOUT |
| | | Pins shared for all PLL |
| | | PLL_RESETN# |
| | | PLL_T[0:1] |
| | | Test control signals |
| PROCESSOR | Pins may be shared for all cores with a second TAP controller. It is the responsibility of the designer to include this pin. | Pins shared for all ARM IP_TAP_TDI IP_TAP_TDK IP_TAP_TMS IP_TAP_TRSTN Note: IP_TAP_TDO and IP_TAP_TDO_ENABLEN |

TABLE 1-continued

EXAMPLE TEST CONNECTIONS

| Object Type | Non-Shared IO Pins | Shared IO Pins |
|---|---|---|
| | IP_TAP | will be connected to primary output TDO |
| High Impedance Controller | High-ZRSET This IO may be managed through the design tool implemented in accordance with the present invention. | HIGH-Z_SCAN_OUT HIGH-Z_CLK# HIGH-Z_RESETN# |
| Scan | | SCAN_IN[0:14] (plus TDI) SCAN_OUT[0:15] SCAN_CLK[0:15] |
| Rcell memory | | LBRAM_SCAN_IN[0:14] LBRAM_SCAN_CLOCK LBRAM_SCAN_OUT[0:14] |
| MBIST | | Pins shared for all memories MBIST_CLK MBIST_CMP_STAT |
| misc: | | SCAN_SETN SCAN_RESETN SCAN_SETRESETN IP_TAP_TDI IP_TAP_TDK IP_TAP_TMS IP_TAP_TRSTN |

Cells marked with an * are generally NOT counted as available IO for the designer. The term LBRAM generally refers to latch-based memory.

After all of the specified test pins have been identified, valid sharing of the test pins may be assigned. A table (e.g., the TABLE 2 below) may be used to identify test pin sharing.

TABLE 2

EXAMPLE TEST PIN SHARING

| Test Signal 1 | Test Signal 2 | Test Signal 3 |
|---|---|---|
| inputs | | |
| scan_in_0 | lbram_scan_in_0 | test_ip_in_0 |
| scan_in_1 | lbram_scan_in_1 | test_ip_in_1 |
| scan_in_2 | lbram_scan_in_2 | test_ip_in_2 |
| scan_in_3 | lbram_scan_in_3 | test_ip_in_3 |
| scan_in_4 | lbram_scan_in_4 | test_ip_in_4 |
| scan_in_5 | lbram_scan_in_5 | test_ip_in_5 |
| scan_in_6 | lbram_scan_in_6 | test_ip_in_6 |
| scan_in_7 | lbram_scan_in_7 | |
| scan_in_8 | lbram_scan_in_8 | |
| scan_in_9 | lbram_scan_in_9 | |
| scan_in_10 | lbram_scan_in_10 | |
| scan_in_11 | lbram_scan_in_11 | |
| scan_in_12 | lbram_scan_in_12 | |
| scan_in_13 | lbram_scan_in_13 | pll_t0 |
| scan_in_14 | lbram_scan_in_14 | pll_t1 |
| scan_resetn | bz_resetn | |
| scan_setn | | |
| scan_setresetn | | |
| ip_tap_tms | | |
| ip_tap_trstn | | |
| ip_tap_tdi | | |
| ip_tap_tck | | |
| pll_resetn | | |
| scan_clock_0 | bz_clock | |
| scan_clock_1 | | |
| scan_clock_2 | | |
| scan_clock_3 | | |

TABLE 2-continued

EXAMPLE TEST PIN SHARING

| Test Signal 1 | Test Signal 2 | Test Signal 3 |
|---|---|---|
| scan_clock_4 | | |
| scan_clock_5 | | |
| scan_clock_6 | | |
| scan_clock_7 | | |
| scan_clock_8 | | |
| scan_clock_9 | | |
| scan_clock_10 | | |
| scan_clock_11 | | |
| scan_clock_12 | | |
| scan_clock_13 | | |
| scan_clock_14 | | |
| scan_clock_15 | | |
| lbram_scan_clock | | |
| pll_ref_clk_0 | | |
| pll_ref_clk_1 | | |
| pll_ref_clk_2 | | |
| pll_ref_clk_3 | | |
| mbist_clock | | |
| rram_clock | | |
| rram_test_clock | | |
| outputs | | |
| scan_out_0 | lbram_scan_out_0 | test_ip_out_0 |
| scan_out_1 | lbram_scan_out_1 | test_ip_out_1 |
| scan_out_2 | lbram_scan_out_2 | test_ip_out_2 |
| scan_out_3 | lbram_scan_out_3 | test_ip_out_3 |
| scan_out_4 | lbram_scan_out_4 | test_ip_out_4 |
| scan_out_5 | lbram_scan_out_5 | test_ip_out_5 |
| scan_out_6 | lbram_scan_out_6 | test_ip_out_6 |
| scan_out_7 | lbram_scan_out_7 | test_ip_out_7 |
| scan_out_8 | lbram_scan_out_8 | test_ip_out_8 |
| scan_out_9 | lbram_scan_out_9 | |
| scan_out_10 | lbram_scan_out_10 | |
| scan_out_11 | lbram_scan_out_11 | rram_test_out |
| scan_out_12 | lbram_scan_out_12 | pll_lock_0 |
| scan_out_13 | lbram_scan_out_13 | pll_lock_1 |
| scan_out_14 | lbram_scan_out_14 | pll_lock_2 |
| scan_out_15 | pll_lock_3 | |
| mbist_cmp_stat | | |
| bz_scan_out_0 | | |
| bz_scan_out_1 | | |
| bz_scan_out_2 | | |
| bz_scan_out_3 | | |
| bz_scan_out_4 | | |
| bz_scan_out_5 | | |
| bz_scan_out_6 | | |

The signal names in TABLE 2 may be consistent with the symbolic signal names used by other applications to input into the design tool. In one example, multiple shared signal names may be input into the test info field in the tool separated by a space. The term lbram generally refers to latch-based memory.

In an automatic test pin assignment process in accordance with the present invention, the slice developer assigns limited test pins during slice development. The assigned test pins may include dedicated test pins and non-configurable IO that are used for sort testing. The assigned pins may be included in the LPC pin count. The remaining LPC test pins are generally identified by the slice developers.

Figure 4:
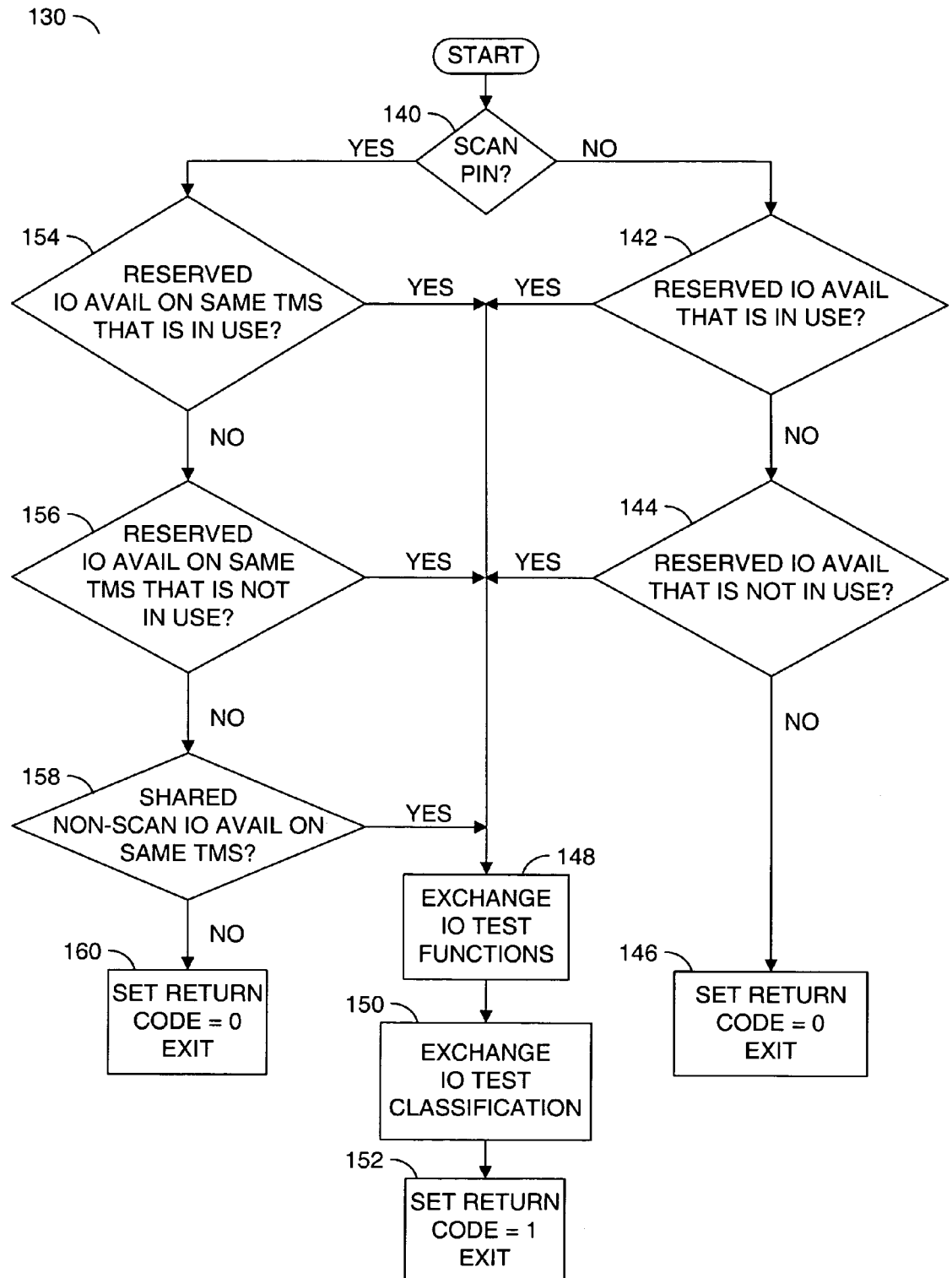
FIG. 4 is a more detailed flow diagram illustrating a process for a dynamic test pin reassignment process of FIG. 3.

Referring to FIG. 4, a more detailed flow diagram is shown illustrating an example implementation of the dynamic test pin reassignment process 130 of FIG. 3 in accordance with a preferred embodiment of the present invention. When the designer selects an IO that is on a LPC pin that is identified as Shared, a determination is made whether the IO selected is compatible with the Test Function (e.g., the block 128 of FIG. 3). In the Dynamic test pin re-assignment 130, a further determination is made whether the IO is assigned a scan test function (e.g., the block 140). When there is no scan test function assigned to the IO, an available reserved IO is sought to determine whether the test function may be swapped. Preference is generally given to an IO that the designer is already using (e.g., the block 142). If no IOs that are already in use are available, an IO is sought that the designer is not using to swap test functions (e.g., the block 144). When no IO is available, the process may set a flag indicating such (e.g., the block 146). When either an IO that is in use or an IO that is not in use is available, the test function and the test classifications between the IOs may be swapped (e.g., the blocks 148 and 150). The process may set a flag indicating the swap has been made (e.g., the block 152).

When the designer selects a scan pin, additional limitations may be placed on swapping test functions and test classifications. In order to select scan test data, both the IOs are checked for the same TMS property assigned to the IO (e.g., the blocks 154 and 156). To maximize scan assignment, an additional search may be performed for scan pins. In one example, a shared IO without scan data may be compared to the selected IO to determine whether the IOs have the same TMS property (e.g., the block 158). When no IO is available, the process may set a flag indicating such (e.g., the block 160). When either a RESERVED IO that is available on the same TMS and is in use, or a RESERVED IO that is available on the same TMS and is not in use, or a shared non-scan IO on the same TMS is available, the test function and the test classifications between the IOs may be swapped (e.g., the blocks 148 and 150). In general, the dynamic test pin re-assignment may be performed transparently to the designer. Transparent dynamic pin re-assignment makes test pin assignments as non-intrusive to the designer as possible.

When the designer selects an IO that is on a LPC pin that is identified as Shared and the IO selected cannot be used for test sharing, the design tool of the present invention is generally configured to check to see whether there is Reserved configurable IO available to swap test functions. In one example, preference may be given to Reserved IOs that the designer is currently using.

When a Reserved IO is available, the design tool may be configured to swap the information that is in the platform test info field between the two IOs. The tool may be configured to also change the platform test usage values between the two IOs (e.g., Shared-ΔReserved and Reserved-ΔShared). In one example, the tool may be configured to generate a file containing test sharing information.

Scan pins generally include scan_in and scan_out (scan_clock pins are not included in this class). In order to maximize tester memory utilization, scan pins are generally distributed across the tester memory segment (TMS). When the designer selects a Shared IO that has scan_in or scan_out in the platform test info field, the tool is generally configured to swap test usage with a Reserved IO only if both the shared IO and the Reserved IO have the same TMS value.

If there are no swapable Shared IOs on a particular TMS, the tool may be configured to determine whether a non-scan Shared IO on the TMS may be moved to allow for the scan pin to be swapped. For example, when there are no available Reserved IOs on TMS1 and the designer selects a non-shareable IO on TMS1 that has a scan pin assignment, the tool generally checks to see whether there are non-scan pins being used on TMS1 that may be moved to another TMS. Moving pins to another TMS may free up TMS1 to be available for a scan pin swap.

The Tester Memory Segment (TMS) information may be used by the tool to facilitate swapping of all test pins, including scan pins. However, when the TMS information is not available, all test pins except scan pins may be moved. The slice developers are generally responsible for defining the TMS for each slice. In one example, a file may be created that maps the package ball information with the TMS. A package ball generally has a TMS listed only when the ball can be used for scan_in or scan_out.

In general, TMS information may be of the form TMSxx where xx denotes the specific segment (e.g., TMS1, TMS2, etc.). The TMS information generally includes an indication of how many scan chains may be in each segment (TMS1=2, TMS2=2, etc.). In one example, the TMS information may be input through an import function of the tool.

The tool may have backward compatibility. When backward compatibility is implemented in the tool, in order to take full advantage of the automation including scan pin swapping, TMS information may be put into the Slice database file(s). If the database has TMS information in the platform test info field, the tool may be configured to allow swapping of all test share functions including scan_in and scan_out. If the database does not have TMS information, the tool may be configured to only swap non-scan (scan_in and scan_out) test share functions.

The present invention may provide checking and verification. In order to use common hardware across multiple instances of a slice, checking is performed to verify common hardware will work. The tool may be configured to verify information between the slice data and test inserted netlist. For example, the tool may verify that the LPC pins in the Slice database are the same LPC pins in the finish database. LPC pins are defined in the platform test usage field as either Shared, Dedicated, or Reserved. The information may be obtained in the slice database and an instance database files. The data may be made available through a text out command of the tool.

The tool may verify that the number of scan_in and scan_out pins that are mapped to each TMS is the same in the Slice database and the finish netlist. All TMS data may be obtained from the slice database file. The platform test info field of the tool may contain the TMS data. In one example, the data may be in the format TMS0, TMS1, etc. The field may also contain test information as described in TABLE 2 above. The slice scan in and scan_out data may be obtained in the slice database file. In one example, the information may be in the platform test info field of the tool. In one example, the information may have the format scan_in_0, scan_in_1, scan_out_0, etc.

When no TMS data is available, the tool may be configured to verify that the exact location of scan_in and scan_out pins are the same in the Slice database and the finish netlist. In general, the data is obtained as described above. The tool may be further configured to verify that all test share pins are assigned to LPC pins. The shared test pin assignment may be obtained from the finish netlist. For example, test pin assignments may be identified in the IO definition file. In one example, the pin assignments may be identified in share_port statements. LPC pins are generally identified in the slice database as described above.

The functions performed by FIGS. 2-4 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A tool for facilitating automatic test pin assignment for a programmable platform device comprising:
   a process for collecting information related to said programmable platform device;
   a process for automatically initializing a test pin assignment for said programmable platform device;
   a process configured to receive user specifications for IOs; and
   a process for performing dynamic test pin reassignment in response to said user specifications.

2. The tool according to claim 1, further comprising:
   a process configured to determine whether a particular IO selection for a design is complete.

3. The tool according to claim 1, further comprising:
   a process configured to determine whether user specified IOs are compatible with a test function.

4. The tool according to claim 3, further comprising:
   a process configured to perform rule checking when user selected IOs are not compatible with said test function.

5. The tool according to claim 1, further comprising:
   a process configured to prompt a user for an IO selection.

6. The tool according to claim 1, wherein each of said processes is performed in response to one or more computer executable instructions.

7. The tool according to claim 6, wherein said computer executable instructions are contained in a computer readable storage medium.

8. The tool according to claim 7, wherein said computer readable storage medium further contains one or more computer executable instructions configured to perform:
   a process configured to determine whether a particular IO selection for a design is complete.

9. The tool according to claim 7, wherein said computer readable storage medium further contains one or more computer executable instructions configured to perform:
   a process configured to determine whether user specified IOs are compatible with a test function;
   a process configured to perform rule checking when user selected IOs are not compatible with said test function; and
   a process configured to prompt a user for an IO selection.

10. The tool according to claim 1, wherein the process for performing dynamic test pin reassignment comprises:
    determining whether a particular IO is a scan pin;

when the particular IO is not a scan pin and a reserved IO is available, exchanging IO test functions and IO test classification between the particular IO and the reserved IO;

when the particular IO is a scan pin and a reserved IO is available with a similar tester memory segment (TMS) property, exchanging IO test function and IO test classification between the particular IO and the reserved IO on the common TMS;

when the particular IO is a scan pin, a reserved IO is not available with the similar tester memory segment (TMS) property and a shared non-scan IO is available with the similar tester memory segment (TMS) property, exchanging IO test function and IO test classification between the particular IO and the shared non-scan IO on the common TMS.

11. A design flow for facilitating automatic test pin assignment for a programmable platform device comprising:
means for collecting information related to automatically initializing test pin assignment;
means for determining whether a particular IO selection for a design is complete;
means for receiving user specifications for IOs;
means for determining whether user specified IOs are compatible with a test function;
means for performing rule checking when user selected IOs are not compatible with said test function;
means for prompting a user for another IO selection; and
means for performing dynamic test pin reassignment.

12. A method for facilitating automatic test pin assignment for a programmable platform device comprising:
collecting information related to said programmable platform device;
generating automatically an initial test pin assignment for said programmable platform device;
receiving user specifications for IOs; and
performing automatically a dynamic test pin reassignment in response to said user specifications.

13. The method according to claim 12, further comprising:
determining whether a particular IO selection for a design is complete.

14. The method according to claim 12, further comprising:
determining whether said user specifications for IOs are compatible with a test function.

15. The method according to claim 14, further comprising:
performing rule checking when user selected IOs are not compatible with said test function.

16. The method according to claim 12, further comprising:
prompting said user for an IO selection.

17. The method according to claim 12, further comprising:
providing one or more sets of computer executable instructions configured to perform said collection of information related to said programmable platform device, said automatic generation of said initial test pin assignment for said programmable platform device, said reception of said user specifications for IOs and said automatic, dynamic test pin reassignment in response to said user specifications.

18. The method according to claim 17, further comprising:
providing said computer executable instructions in a computer readable storage medium.

19. The method according to claim 18, wherein said computer readable storage medium further contains one or more computer executable instructions configured to determine whether a particular IO selection for a design is complete.

20. The method according to claim 18, wherein said computer readable storage medium further contains one or more computer executable instructions configured (i) to determine whether user specified IOs are compatible with a test function, (ii) to perform rule checking when user selected IOs are not compatible with said test function and (iii) to prompt a user for an IO selection.

* * * * *